(12) United States Patent
Liu et al.

(10) Patent No.: US 8,697,463 B2
(45) Date of Patent: Apr. 15, 2014

(54) MANUFACTURING METHOD OF A LIGHT-EMITTING DEVICE

(75) Inventors: Chih-Hui Alston Liu, Kaohsiung (TW); Tsung-Pao Yeh, Kaohsiung (TW); Chang Yi-Cheng, Tainan (TW); Liao Chuen-Min, Taichung (TW)

(73) Assignee: Epistar Corporation, Hsinchu (TW)

( * ) Notice: Subject to any disclaimer, the term of this patent is extended or adjusted under 35 U.S.C. 154(b) by 73 days.

(21) Appl. No.: 13/358,869

(22) Filed: Jan. 26, 2012

(65) Prior Publication Data
US 2013/0196461 A1 Aug. 1, 2013

(51) Int. Cl.
*H01L 21/00* (2006.01)

(52) U.S. Cl.
USPC ............... 438/33; 257/E33.002; 257/E21.386

(58) Field of Classification Search
USPC ...................... 438/33; 257/E33.002, E21.097, 257/E21.099, E21.386; 219/121.67
See application file for complete search history.

(56) References Cited

U.S. PATENT DOCUMENTS

| | | |
|---|---|---|
| 2008/0194080 A1 | 8/2008 | Cheng et al. |
| 2010/0120228 A1* | 5/2010 | Saito et al. ................... 438/463 |
| 2010/0200885 A1 | 8/2010 | Hsu et al. |
| 2011/0095006 A1 | 4/2011 | Hayashi |
| 2011/0318877 A1* | 12/2011 | Akiyama ....................... 438/113 |
| 2012/0190174 A1* | 7/2012 | Ryu et al. ...................... 438/463 |
| 2013/0011949 A1* | 1/2013 | Chung et al. ................... 438/33 |

* cited by examiner

*Primary Examiner* — Caridad Everhart
(74) *Attorney, Agent, or Firm* — Muncy, Geissler, Olds & Lowe, P.C.

(57) ABSTRACT

A method for manufacturing a light-emitting device includes steps of: providing a light-emitting wafer including an upper surface and a lower surface opposite to the upper surface; setting a plurality of scribing streets on the upper surface of the light-emitting wafer; irradiating a laser beam to form a plurality of cutting regions along the scribing streets, wherein each of the plurality of cutting regions has a sharp end, or the plurality of cutting regions forms a specific pattern in a cross-sectional view; and forming a plurality of light-emitting devices by connecting the plurality of cutting regions and extending the plurality of cutting regions from the respective sharp ends thereof to the lower surface of the light-emitting wafer.

19 Claims, 5 Drawing Sheets

MANUFACTURING METHOD OF A LIGHT-EMITTING DEVICE

TECHNICAL FIELD

The application relates to a manufacturing method of a light-emitting device.

DESCRIPTION OF BACKGROUND ART

The light radiation theory of light emitting diode (LED) is to generate light from the energy released by the electron moving between an n-type semiconductor and a p-type semiconductor. Because the light radiation theory of LED is different from the incandescent light which heats the filament, the LED is called a "cold" light source. Moreover, the LED is more sustainable, longevous, light and handy, and less power-consumption, therefore it is considered as another option of the light source for the illumination markets. The LED applies to various applications like the traffic signal, backlight module, street light, and medical instruments, and is gradually replacing the traditional lighting sources.

FIG. 1 illustrates the structure of a conventional light emitting device 100 which includes a transparent substrate 10, a semiconductor stack 12 formed above the transparent substrate 10, and an electrode 14 formed above the semiconductor stack 12, wherein the semiconductor stack 12 comprises a first conductive-type semiconductor layer 120, an active layer 122, and a second conductive-type semiconductor layer 124.

In addition, the light emitting device 100 can be further connected to other components in order to form a light emitting apparatus.

The light-emitting device 100 may be mounted onto a submount by the side of the substrate 10, or a solder bump or a glue material may be formed between the submount and the light-emitting device 100, therefore a light-emitting apparatus is formed. Besides, the submount further comprises one circuit layout electrically connected to the electrode of the light-emitting device via an electrical conductive structure such as a metal wire.

SUMMARY OF THE DISCLOSURE

A method for manufacturing a light-emitting device includes steps of: providing a light-emitting wafer comprising an upper surface and a lower surface opposite to the upper surface; setting a plurality of scribing streets on the upper surface of the light-emitting wafer; irradiating a laser beam to form a plurality of cutting regions along the scribing streets, wherein each of the plurality of cutting regions has a sharp end.

A method for manufacturing a light-emitting device includes steps of: providing a light-emitting wafer comprising an upper surface and a lower surface opposite to the upper surface; setting a plurality of scribing streets on the upper surface of the light-emitting wafer; irradiating a laser beam to form a plurality of cutting regions along the scribing streets, wherein the width of each of the plurality of cutting regions is between 5 μm to 100 μm, and the thickness of each of the plurality of cutting regions is between 5 μm to 50 μm, and the distances of the adjacent cutting regions are between 5 μm to 100 μm.

A method for manufacturing a light-emitting device includes steps of: providing a light-emitting wafer comprising an upper surface and a lower surface opposite to the upper surface; setting a plurality of scribing streets on the upper surface of the light-emitting wafer; irradiating a laser beam along the scribing streets and adjusting the intensity of the laser beam to form a cutting structure including at least a ladder-type pattern in a cross-sectional view.

DETAILED DESCRIPTION OF PREFERRED EMBODIMENTS

Figure 1:
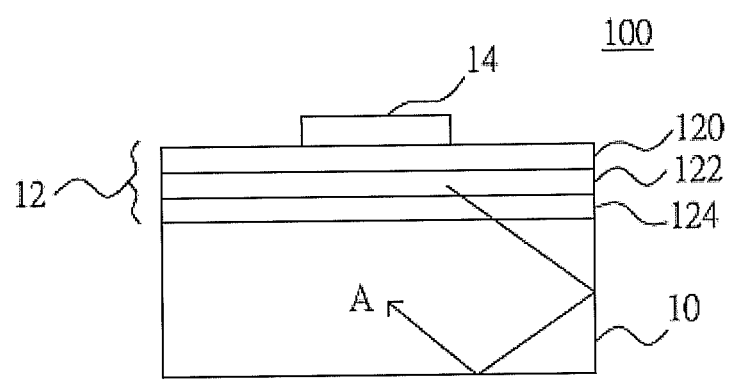
FIG. 1 illustrates the structure of a conventional light-emitting device.
Figure 2A:
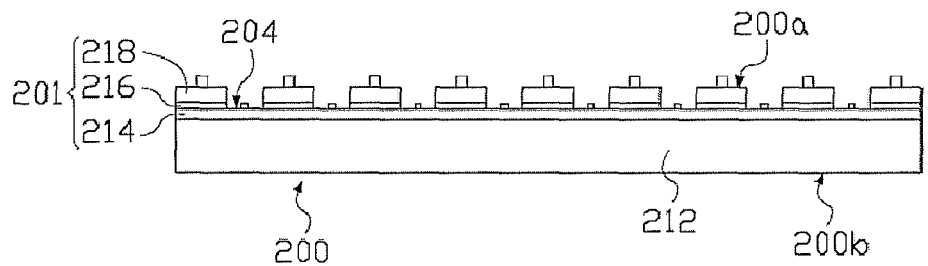
FIGS. 2A to 2D show a method for manufacturing a light-emitting device of a first embodiment of the present application.
Figure 2B:
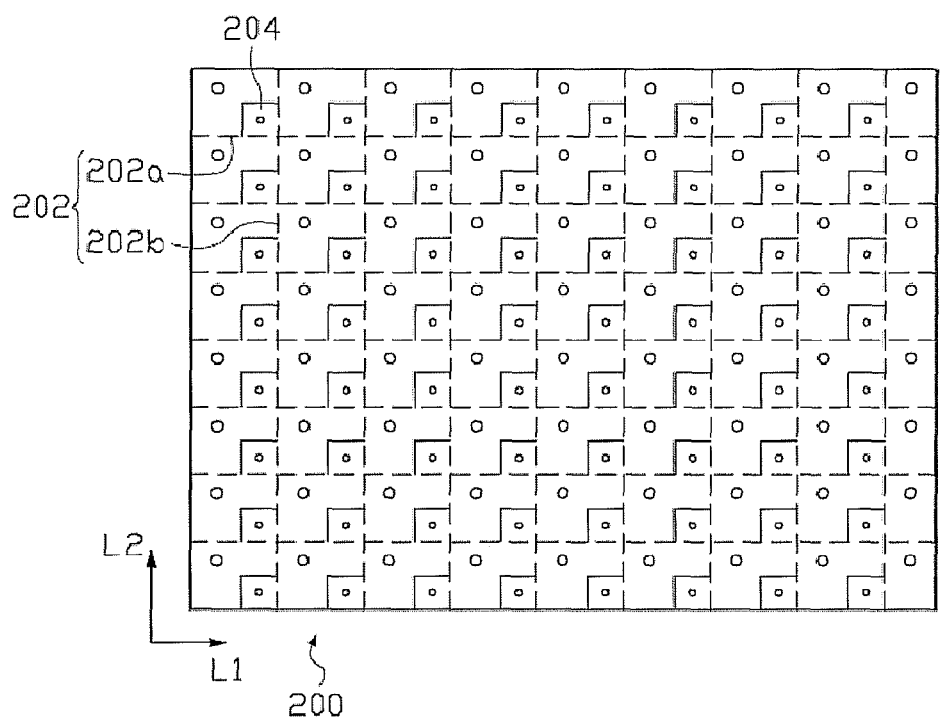
Figure 2C:
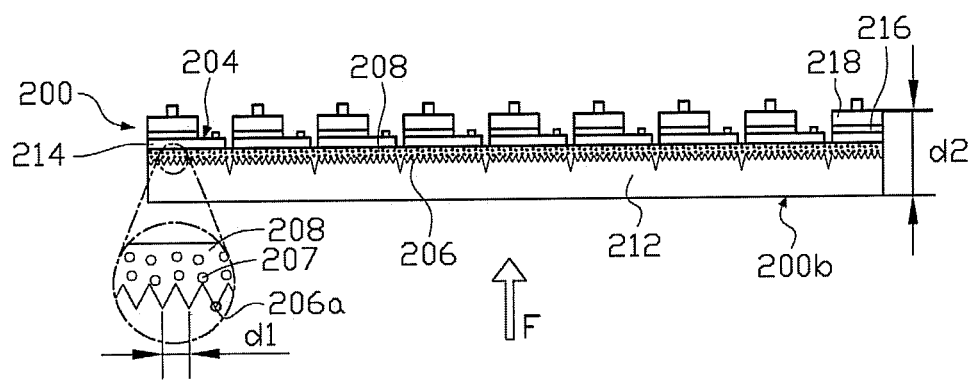

As shown in FIGS. 2A to 2C, a light-emitting wafer 200 having an upper surface 200a and a lower surface 200b opposite to the upper surface 200a, and including a substrate 212 and a light-emitting stack 201 formed on the substrate 212 is provided. The light-emitting stack 201 includes a first semiconductor layer 214, an active layer 216, and a second semiconductor layer 218 formed on the substrate. A plurality of mesa areas 204 can be formed by removing partial regions including the second semiconductor layer 218 and the active layer 216 and exposing the first semiconductor layer 214. Referring to FIG. 2B, a scribing street 202 can be determined by the plurality of mesa areas 204. The scribing street 202 includes a plurality of first scribing lines 202a parallel to a first direction L1 and a plurality of second scribing lines 202b parallel to a second direction L2 set on the light-emitting wafer 200, and based on the arrangement of the mesa areas, the first direction L1 can be substantially perpendicular to the second direction L2. The light-emitting wafer 200 can be fixed on a movable supporting member (not shown) for receiving a laser beam irradiated from a laser apparatus. After the light-emitting wafer 200 being fixed on the movable supporting member, the laser apparatus can be active and the supporting member can move laterally to receive the laser beam along the scribing street 202.

Figure 2D:
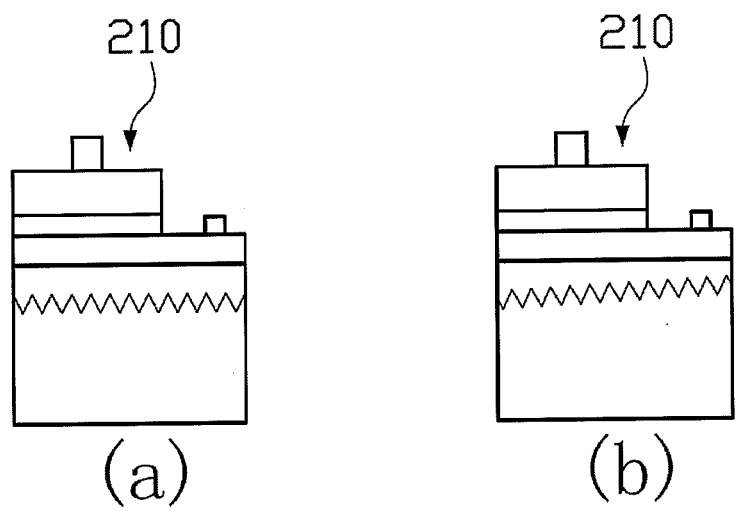

Referring to FIG. 2C, by controlling the moving speed of the light-emitting wafer 200, and the irradiating frequency, the irradiating focal point, and the irradiating power of the laser beam, a plurality of cutting regions 206 can be formed through the first semiconductor layer 214 and extended into the substrate 212. Each of the cutting regions 206 has a sharp end 206a toward the lower surface 200b. Each distance $d_1$ between the adjacent sharp ends 206a of the cutting regions 206 is between 1 μm to 10 μm, and the depths $d_2$ of the cutting regions 206 are between 10 μm to 30 μm. The laser beam can be periodically irradiated to the light-emitting wafer 200, and the light-emitting wafer 200 can move in a regular speed, therefore each distance $d_1$ can approximately remain the same. The upper portion 208 of the plurality of cutting regions 206 can be continuous to each other. In a cross-sectional view, the plurality of cutting regions 206 forms a wave-liked pattern. After the plurality of cutting regions 206 is formed, a laser-byproduct 207 may be formed on the cutting regions 206, and a procedure for removing the laser-byproduct 207 can be applied. When the substrate 212 is Sapphire, and the material of the first semiconductor layer 214, the active layer 216, and the second semiconductor layer 218 are Nitride based semiconductor, the laser-byproduct 207 is formed from the reaction between Sapphire and the laser beam and can be removed by a heated $H_2SO_4$ solution. After removing the laser-by product 207, a separating force F can be provided to the lower surface 200b of the light-emitting wafer 200, therefore the sharp ends 206a are extended to the lower surface 200b of the light-emitting wafer 200. Conventionally, laser-dicing method used to separating a light-emitting wafer must focus on a focal point in a deep location (about 70~100 μm from the upper surface of the light-emitting wafer) of the light-emitting wafer, thereby increasing the cutting area that blocks the light on the side-wall of the light-emitting device diced from the light-emitting wafer. In the present application, the break from the lower surface 200b can be easily guided from the sharp ends 206a, and the depths $d_2$ of the cutting regions 206 determined by the irradiating focus of the laser beam can be less than that formed by the conventional laser-dicing method, and therefore the light blocking area composed of the cutting regions 206 is greatly decreased. As shown in FIG. 2D, a plurality of light-emitting devices 210 is separated from each other, and the light-extraction of each of the light-emitting devices 210 increases at least 2% comparing with that of the device made by conventional laser-dicing method.

Figure 3A:
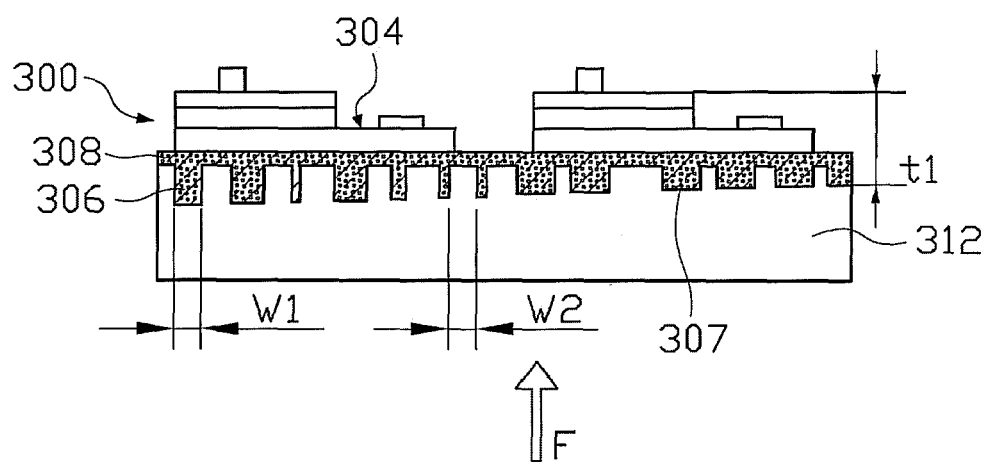
FIGS. 3A to 3B show a method for manufacturing a light-emitting device of a second embodiment of the present application.
Figure 3B:
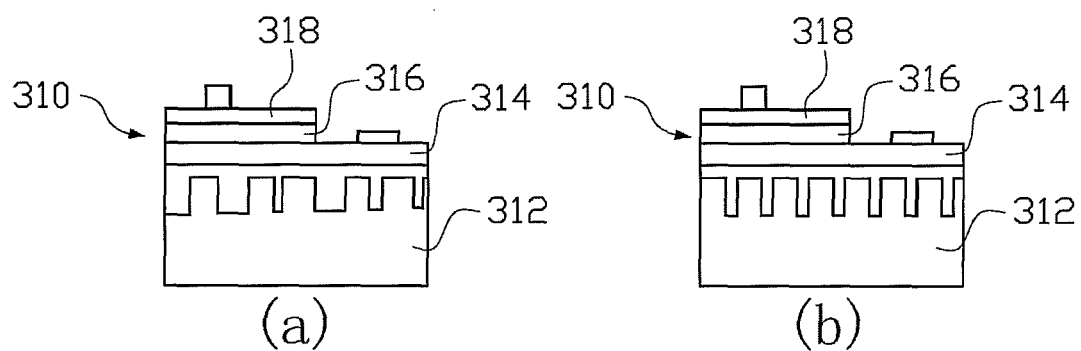

As shown in FIGS. 3A and 3B, a method for manufacturing a light-emitting device of a second embodiment of the present application is disclosed. The present embodiment is similar to the first embodiment except that the cutting regions are different from that of the first embodiment. The steps of providing the light-emitting wafer 300 and forming the mesa areas 304 are the same with that of the first embodiment. A plurality of cutting regions 306 can be formed by irradiating a laser beam along the scribing streets (not shown), and the width $W_1$ of each of the plurality of cutting regions 306 is between 5 μm to 100 μm, the thickness $t_1$ of each cutting region 306 is between 5 μm to 50 μm, and the distance $W_2$ of the adjacent cutting regions is between 5 μm to 100 μm. The plurality of cutting regions 306 forms a pattern similar to wall of a castle in a cross-sectional view. A continuous cutting region 308 can be optionally formed over the plurality of cutting regions 306. The continuous cutting region 308 and the plurality of cutting regions 306 can be simultaneously formed by adjusting the intensity of the laser beam. After the plurality of cutting regions 306 are formed and the laser-byproduct 307 is cleaned, a separating force F can be provided to the lower surface 302b of the light-emitting wafer 300, therefore the cutting regions 306 are extended to the lower surface 302b of the light-emitting wafer 300. Comparing with the conventional laser-dicing method that makes larger light-blocking area on the separated light-emitting device, the pattern formed by the plurality of cutting regions 306 occupies less area on the side surface of separated light-emitting device. As shown in FIG. 3B, multiple light-emitting devices 310 are separated to each other. Each of the light-emitting devices 310 includes a substrate 312, a first semiconductor layer 314, an active layer 316, and a second semiconductor layer 318.

Figure 4A:
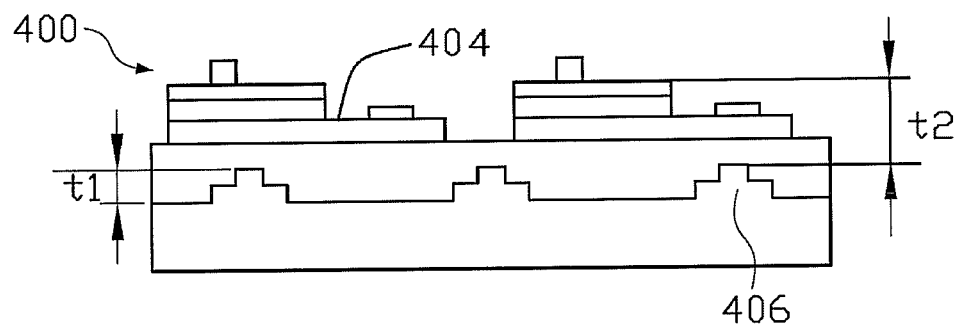
FIGS. 4A to 4C show a method for manufacturing a light-emitting device of a third embodiment of the present application.
Figure 4B:
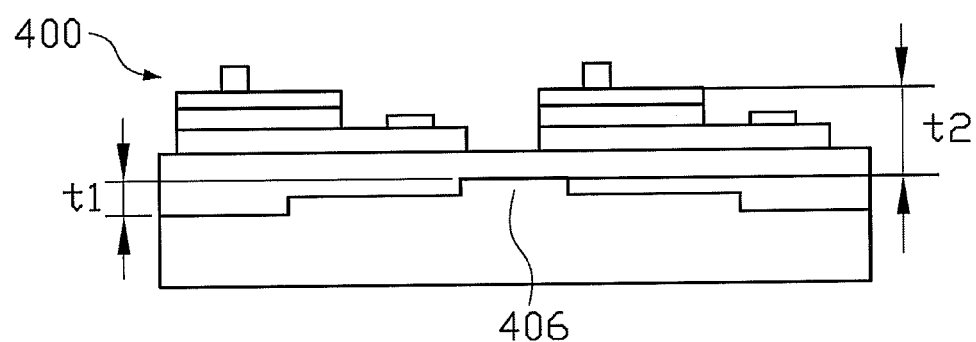
Figure 4C:
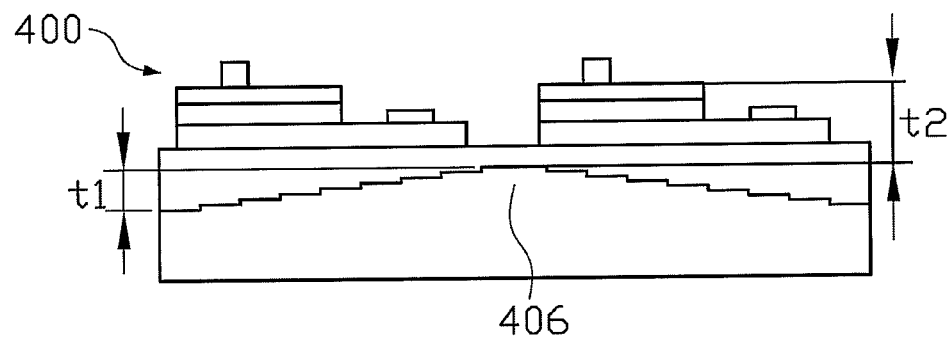

As shown in FIGS. 4A to 4C, a method for manufacturing a light-emitting device of a third embodiment of the present application is disclosed. The present embodiment is similar to the aforesaid embodiments except that the cutting regions are different from that of the first embodiment. The steps of providing the light-emitting wafer 400 and forming the mesa areas 404 are the same with that of the aforesaid embodiments. A cutting structure 406 including at least a ladder-type pattern in a cross-sectional view is formed by irradiating and adjusting the intensity of a laser beam (not shown) along predetermined scribing streets (not shown). FIGS. 4A to 4C show some different scales of the ladder-type patterns of the cutting structure 406. The thickness $t_1$ of the ladder-type pattern can be between 15 μm to 25 μm, and the distances $t_2$ between the upper surface of the light-emitting wafer 400 and the highest portions of the ladder-type patterns can be less than 5 μm.

Each of the first semiconductor layer, active layer, and second semiconductor layer of the aforesaid embodiments can be formed in an MOCVD chamber and composed of materials such as the series of aluminum gallium indium phosphide (AlGaInP), the series of aluminum gallium indium nitride (AlGaInN), and/or the series of zinc oxide (ZnO). The active layer 308 can be configured to be a single heterostructure (SH), a double heterostructure (DH), a double-side double heterostructure (DDH), or a multi-quantum well (MQW) structure.

The substrate of the light-emitting wafer of the aforesaid embodiment can include Sapphire, SiC, Si, GaAs or other material for forming a light-emitting stack thereon by epitaxial growth, or a bonding structure can form between the substrate and the light-emitting stack, and the substrate can be a transparent material such as Sapphire, SiC, Diamond or glass, or a high heat-dissipation material such as metal or ceramic.

Although the present application has been explained above, it is not the limitation of the range, the sequence in practice, the material in practice, or the method in practice. Any modification or decoration for present application is not detached from the spirit and the range of such.

What is claimed is:

1. A method for manufacturing a light-emitting device comprising steps of:
   providing a light-emitting wafer comprising an upper surface and a lower surface opposite to the upper surface;
   setting a plurality of scribing streets on the upper surface of the light-emitting wafer;
   irradiating a laser beam to form a plurality of cutting regions along the scribing streets,
   wherein each of the plurality of cutting regions has a sharp end, and the distances between the adjacent sharp ends of the cutting regions are between 1 μm to 10 μm.

2. The method according to claim 1, wherein the depths of the plurality of cutting regions are between 10 μm to 30 μm and determined by the irradiating power and the focal point of the laser beam.

3. The method according to claim 1, the plurality of cutting regions forms a wave-liked pattern in a cross-sectional view.

4. The method according to claim 1, further comprising forming a plurality of light-emitting devices by providing a separating force on the lower surface of the light-emitting wafer to extend the plurality of cutting regions thereto.

5. The method according to claim 4, further comprising forming a plurality of mesa areas on the upper surface of the light-emitting wafer, wherein the scribing streets are formed by the mesa areas to define the plurality of light-emitting devices.

6. The method according to claim 1, wherein the laser beam is irradiated to the upper surface of the light-emitting wafer periodically, and the light-emitting wafer is laterally moved.

7. The method according to claim 6 wherein the distance between the adjacent sharp ends is determined by the irradiating frequency of the laser beam and moving speed of the light-emitting wafer.

8. The method according to claim 1, wherein a laser-byproduct is further formed when a laser beam irradiates in the plurality of cutting regions.

9. The method according to claim 8, further comprising a step of removing the laser-byproduct.

10. A method for manufacturing a light-emitting device comprising steps of:
- providing a light-emitting wafer comprising an upper surface and a lower surface opposite to the upper surface;
- setting a plurality of scribing streets on the upper surface of the light-emitting wafer;
- irradiating a laser beam to form a plurality of cutting regions along the scribing streets,
- wherein the width of each of the plurality of cutting regions is between 5 μm to 100 μm, and the thickness of each of the plurality of cutting regions is between 5 μm to 50 μm, and the distances of the adjacent cutting regions are between 5 m to 100 μm.

11. The method according to claim 10, wherein a laser-byproduct is formed on the plurality of cutting regions after forming the plurality of cutting regions, and further comprising a step of removing the laser-byproduct.

12. The method according to claim 10, further comprising forming a plurality of light-emitting devices by providing a separating force on the lower surface of the light-emitting wafer to extend the plurality of cutting regions thereto.

13. The method according to claim 10, further comprising forming a plurality of mesa areas on the upper surface of the light-emitting wafer after providing the light-emitting wafer, wherein the scribing streets are formed by the mesa areas to define the plurality of light-emitting devices.

14. The method according to claim 10, further comprising forming a plurality of continuous cutting regions along the scribing streets, and the cutting regions are simultaneously formed below the continuous cutting, regions by adjusting the intensity of the laser beam.

15. The method according to claim 14, wherein the depths of the continuous cutting regions are between 0 μm to 20 μm.

16. A method for manufacturing a light-emitting device comprising steps of:
- providing a light-emitting wafer comprising an upper surface and a lower surface opposite to the upper surface;
- setting a plurality of scribing streets on the upper surface of the light-emitting wafer;
- irradiating a laser beam along the scribing streets and adjusting the intensity of the laser beam to form a cutting structure comprising at least a ladder-type pattern in a cross-sectional view.

17. The method according to claim 16, further comprising forming a plurality of light-emitting devices by providing a separating force on the lower surface of the light-emitting wafer to extend the cutting structure thereto.

18. The method according to claim 16, wherein the distances between the upper surface and the highest portions of the ladder-type patterns are less than 5 μm.

19. The method according to claim 16, wherein the thicknesses of the ladder-type patterns are between 15 μm to 25 μm.

* * * * *